United States Patent [19]
Goetschel et al.

[11] Patent Number: 5,491,447
[45] Date of Patent: Feb. 13, 1996

[54] OPERATIONAL TRANSCONDUCTANCE AMPLIFIER WITH INDEPENDENT TRANSCONDUCTANCE AND COMMON MODE FEEDBACK CONTROL

[75] Inventors: Christian J. Goetschel; Robert A. Greene; Robert A. Kertis; Rick A. Philpott; Raymond A. Richetta, all of Rochester; Timothy J. Schmerbeck, Kasson; Donald J. Schulte, Rochester; David P. Swart, Pine Island, all of Minn.

[73] Assignee: International Business Machines Corporation, Armonk, N.Y.

[21] Appl. No.: 242,219

[22] Filed: May 13, 1994

[51] Int. Cl.[6] .................................................. H03F 3/45
[52] U.S. Cl. .......................... 330/254; 330/258; 330/303; 330/305; 330/306
[58] Field of Search .................................. 330/254, 258, 330/303, 305, 306

[56] References Cited

U.S. PATENT DOCUMENTS

| | | |
|---|---|---|
| Re. 33,055 | 9/1989 | Labbe et al. . |
| 4,656,436 | 4/1987 | Saari . |
| 4,667,165 | 5/1987 | De Weck .................... 330/258 X |
| 4,695,806 | 9/1987 | Barrett ........................ 330/254 |
| 4,823,092 | 4/1989 | Pennock . |
| 4,881,043 | 11/1989 | Jason . |
| 4,931,746 | 6/1990 | Tränkle et al. ............... 330/254 |
| 4,996,498 | 2/1991 | Hanna . |
| 5,001,441 | 3/1991 | Gen-Kuong . |
| 5,028,884 | 7/1991 | Kondo et al. ................ 330/303 |
| 5,063,356 | 11/1991 | Voorman ..................... 330/306 |
| 5,182,477 | 1/1993 | Yamasaki et al. ............ 330/306 X |
| 5,185,581 | 2/1993 | Brown ........................ 330/254 |
| 5,235,540 | 8/1993 | DeVeirman . |
| 5,245,565 | 9/1993 | Petersen et al. . |
| 5,283,483 | 2/1994 | Laber et al. . |
| 5,283,535 | 2/1994 | Sevenhans et al. . |
| 5,345,190 | 9/1994 | Kaylor ........................ 330/303 X |
| 5,357,208 | 10/1994 | Nelson ........................ 330/306 X |
| 5,392,003 | 2/1995 | Nag et al. ................... 330/258 X |

FOREIGN PATENT DOCUMENTS

| | | |
|---|---|---|
| 99810 | 6/1982 | Japan ......................... 330/254 |
| 1137810 | 5/1989 | Japan . |
| 1136406 | 5/1989 | Japan . |
| 126816 | 5/1989 | Japan ......................... 330/254 |

OTHER PUBLICATIONS

Geiger, Randall L. and Edgar Sanchez–Sinencio, "Active Filter Design Using Operational Transconductance Amplifiers: A Tutorial," *IEEE Circuits and Devices Magazine*, Mar. 1985, pp. 20–32.

*Primary Examiner*—James B. Mullins
*Attorney, Agent, or Firm*—Joan Pennington; J. Michael Anglin

[57] ABSTRACT

An integrated biquadratic, continuous-time filter section includes a plurality of operational transconductance amplifiers (OTAs). Simultaneously changing a transconductance (GM) of each of the OTAs is provided by adjusting a differential voltage applied to a plurality of differential transistor pairs of each OTA. Each of the OTAs include a plurality of current sources and a common mode feedback circuit for controlling a common mode output voltage level. Changing the transconductance of the OTA is independent of the common mode voltage level control.

13 Claims, 7 Drawing Sheets

5,491,447

OPERATIONAL TRANSCONDUCTANCE AMPLIFIER WITH INDEPENDENT TRANSCONDUCTANCE AND COMMON MODE FEEDBACK CONTROL

BACKGROUND OF THE INVENTION

1. Field of the Invention

The present invention relates to integrated operational transconductance amplifiers.

2. Description of the Prior Art

Integrated continuous-time filters using bipolar complementary metal oxide semiconductor (BICMOS) operational transconductance amplifiers (OTAs) are known. A prior art operational transconductance amplifier (OTA) is shown in FIG. 4. In this OTA design the transconductance GM is set by the ratio of two currents. In this circuit GM=Itune/(R0*Ibias) and Itune is adjusted to change the GM of this OTA. Matching of the GM of multiple OTAs is set by the matching of current sources Itune required for each OTA. Matching of current sources is difficult due to typical analog circuit matching errors. Another problem of this prior art arrangement is that the signal path is susceptible to Miller multiplication of the capacitance at the JOUTP/JOUTN pins by way of the Q0/Q1 differential pair.

Prior art common mode control schemes tend to require a high power supply voltage and do not accurately control the common mode voltage at the high impedance nodes JOUTP and JOUTN in FIG. 4. Another problem with some prior art circuits is that the adjustment of the transconductance GM interacts with the common mode voltage level control.

A need exists for an OTA that facilitates more efficient adjustment of GM than known prior art arrangements. It is desirable to provide a continuous-time filter section using OTAs with accurate, effective and reproducible responses.

SUMMARY OF THE INVENTION

Important objects of the present invention are to provide an integrated biquadratic, continuous-time filter section using operational transconductance amplifiers that overcomes many of the disadvantages of known operational transconductance amplifiers; and to provide such operational transconductance amplifiers that facilitate efficient and accurate operations.

In brief, the objects and advantages of the present invention are achieved by an integrated biquadratic, continuous-time filter section including a plurality of operational transconductance amplifiers (OTAs). Simultaneously changing a transconductance (GM) of each of the OTAs is provided by adjusting a differential input voltage. Each of said OTAs include a plurality of current sources and a common mode feedback circuit for controlling a common mode output voltage level. A feature of the invention is that changing the transconductance of the OTA is independent of the common mode voltage level control.

BRIEF DESCRIPTION OF THE DRAWING

The present invention, together with the above and other objects and advantages, can best be understood from the following detailed description of the embodiment of the invention illustrated in the drawing, wherein.

DETAILED DESCRIPTION OF THE PREFERRED EMBODIMENTS

Figure 1:
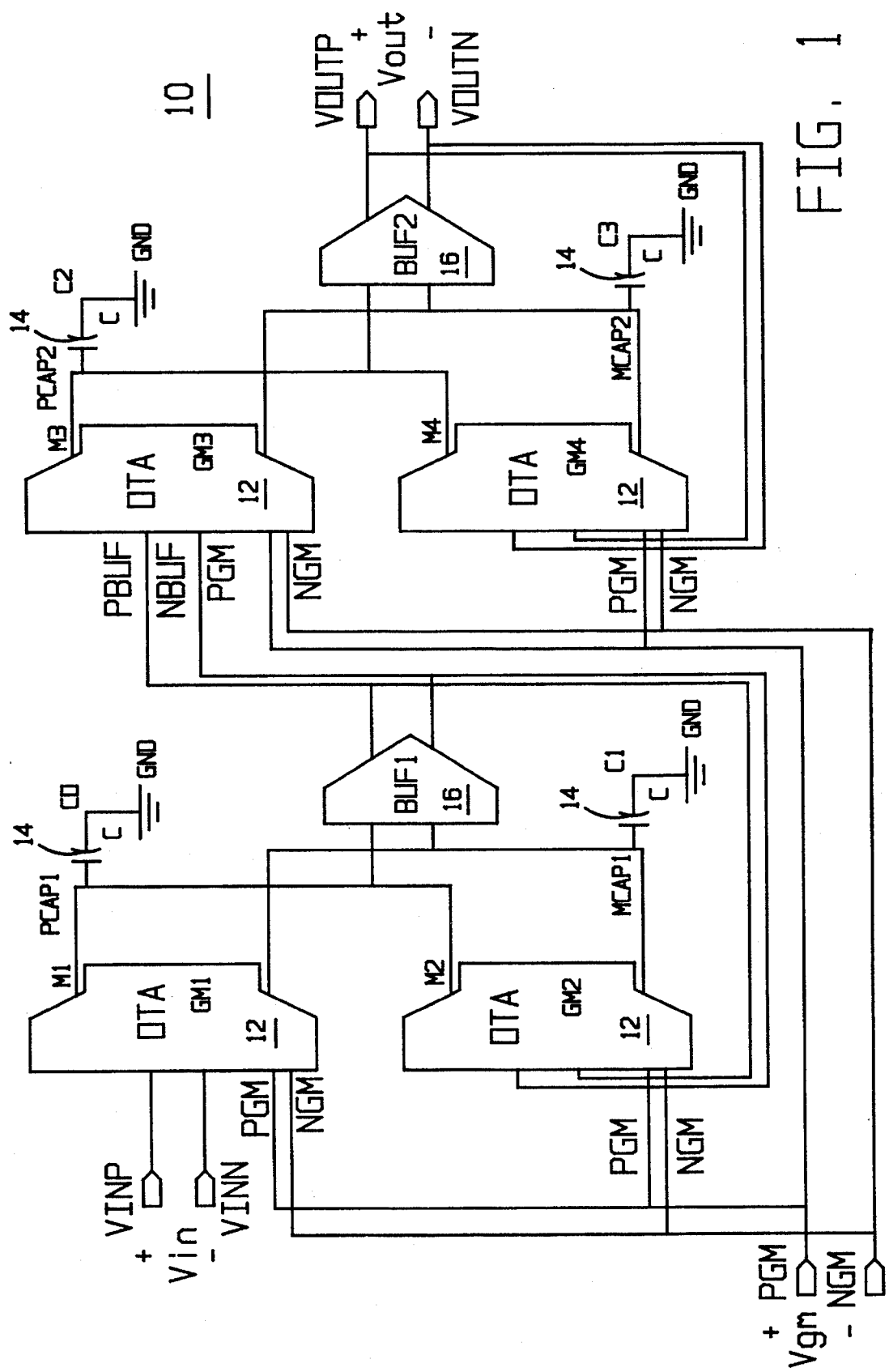
FIG. 1 is a schematic and block diagram representation of a biquadratic (biquad) filter section using operational transconductance amplifiers (OTAs) of the invention.

Referring now to the drawing, in FIG. 1 there is illustrated a schematic and block diagram representation of an integrated biquadratic (biquad) filter section generally designated by the reference character 10. Biquad filter section 10 includes four operational transconductance amplifiers (OTAs) 12, each having a respective transconductance GM1, GM2, GM3 and GM4 as shown, four signal path compensation capacitors 14, (C0, C1, C2 and C3), each having a capacitor size C and a pair of filter section output voltage buffers 16, each having a gain of 1. OTAs 12 are effective to operate with a power supply as low as 2.8 volts. Filter section 10 can implement a low pass filter section having a cut-off frequency tunable from 22 to 66 Mhz.

Figure 2:
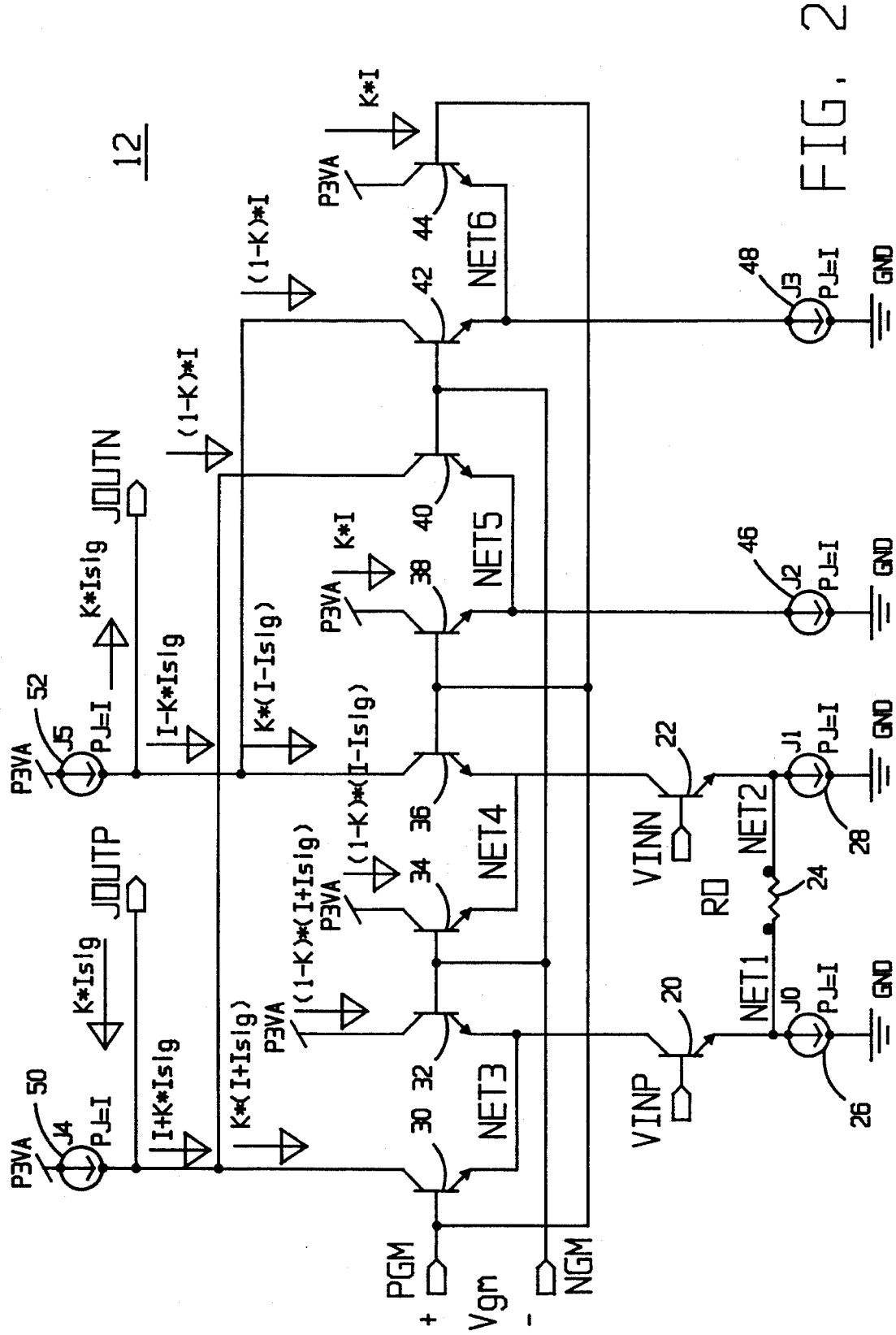
FIG. 2 is a schematic diagram illustrating a variable transconductance feature of an operational transconductance amplifier (OTA) of the invention that can be used in the biquad filter section of FIG. 1.

In accordance with the present invention, a new and improved arrangement is provided for simultaneously changing or tuning the transconductance (GM) of each of the operational transconductance amplifiers 12 as illustrated and described with respect to FIG. 2 including a new common mode feedback circuit as illustrated and described with respect to FIG. 3. A feature of the invention is that changing the transconductance GM of the OTA is independent of the common mode voltage level control. In other words, an advantage of the invention is that there is no interaction between the common mode voltage level control and the adjustment of the transconductance GM.

A transfer function of the filter section 10 is defined by:

$$\frac{Vin}{Vout} = \frac{GM1*GM3}{S^2*C^2 + S*C*GM4 + GM2*GM3}$$

Two important figures of merit for a filter transfer function are the filter corner frequency Wo and the Quality factor Q of the poles. From the transfer function, it can be shown that Wo and Q for filter section 10 are defined by:

$$Wo=(GM2*GM3)^{0.5}/C$$

$$Q=(GM2*GM3)^{0.5}/GM4$$

Note that the Wo depends on the capacitor size C and GMs, and that Q depends only on GMs. The corner or cut-off frequency, Wo of the biquad filter section 10, is changed by the simultaneous adjustment of the GM of each of the OTAs. Also note that Q is constant since it depends upon the ratio of GMs. Simultaneously changing the GM for each of the OTAs 12 is provided by adjusting the differential voltage Vgm.

FIG. 2 is a schematic diagram of a portion of an OTA 12 illustrating a GM adjustment feature of the invention. The input voltage signal Vin is applied to pins VINP and VINN, which drive an NPN differential pair formed by NPN transistors 20 and 22 and emitter degeneration resistor (R0) 24. Bias current of I is provided to the input differential transistor pair 20 and 22 from a respective one of current sources (J0 and J1) 26 and 28. The differential current outputs of OTA 12 are pins labelled JOUTP and JOUTN.

The variability of the OTAs GM is accomplished by four differential pairs formed by NPN transistors 30 and 32, 34 and 36, 38 and 40, and 42 and 44. Current sources (J2 and J3) 46 and 48 provide a bias current of I to differential pairs 38 and 40 and 42 and 44. The GM of OTA 12 is tuned as the differential voltage Vgm across input pins labelled PGM and NGM is changed. GM increases exponentially with respect to the Vgm voltage. As Vgm is increased, the current in NPN transistors 30, 34, 38 and 42 increases while the current in NPN transistors 32, 36, 40 and 44 decreases.

The currents in NPN transistors 30, 32, 34, 36, 38, 40, 42 and 44 are governed by the diode equation $$n = I_{pgm}/I_{ngm} = \exp(Vgm/Vt) mV,$$

(Vt=kT/q(thermal voltage)=26mV at 27° C.), where Ipgm is the collector current of any of the NPN transistors 30, 36, 38 and 44 connected to the PGM pin and Ingm is the collector current of any of the NPN transistors 32, 34, 40 and 42 connected to the NGM pin or n is defined by:

$$n = I_{30}/I_{32} = I_{36}/I_{34} = I_{38}/I_{40} = I_{44}/I_{42}$$

Furthermore, it can be shown that the portion of the collector current of NPN transistor 20 or 22 that reaches NPN transistor 30 or 32 respectively is K, which is equal to n/(n+1). The transconductance GM is defined by:

$$GM = K/R0 = n/(n+1)*R0$$

The collector currents in each of the NPN devices 30, 32, 34, 36, 38, 40, 42 and 44 is as follows:

| DEVICE NUMBER | COLLECTOR CURRENT |
| --- | --- |
| 30 | $K*(I + Isig)$ |
| 32 | $(1 - K)*(I + Isig)$ |
| 34 | $(1 - K)*(I - Isig)$ |
| 36 | $K*(I - Isig)$ |
| 38 | $K*(I)$ |
| 40 | $(1 - K)*(I)$ |
| 42 | $(1 - K)*(I)$ |
| 44 | $K*(I)$ |

Where Isig is Vin*GMmax and GMmax is approximately 1/R0. Note that the current sunk at JOUTP is the sum of the currents of NPN transistors 30 and 40 for a total of I+K*Isig, and that the current sunk at JOUTN is the sum of currents of the NPN transistors 36 and 42 for a total of I-K*Isig. Furthermore, consider that each of the JOUTP and JOUTN pins have current sources (J4 and J5) 50 and 52 sourcing a current of value I into them. The net effect is that a current of K*Isig is sunk at the JOUTP pin while a current of equal but opposite sign appears at JOUTN. So the output current can be expressed as:

$$Joutp = K*GMmax*Vin$$

$$Joutn = -K*GMmax*Vin$$

where K is between zero and one. Since K depends on Vgm, the transconductance GM is changed or tuned by changing Vgm.

Figure 4:
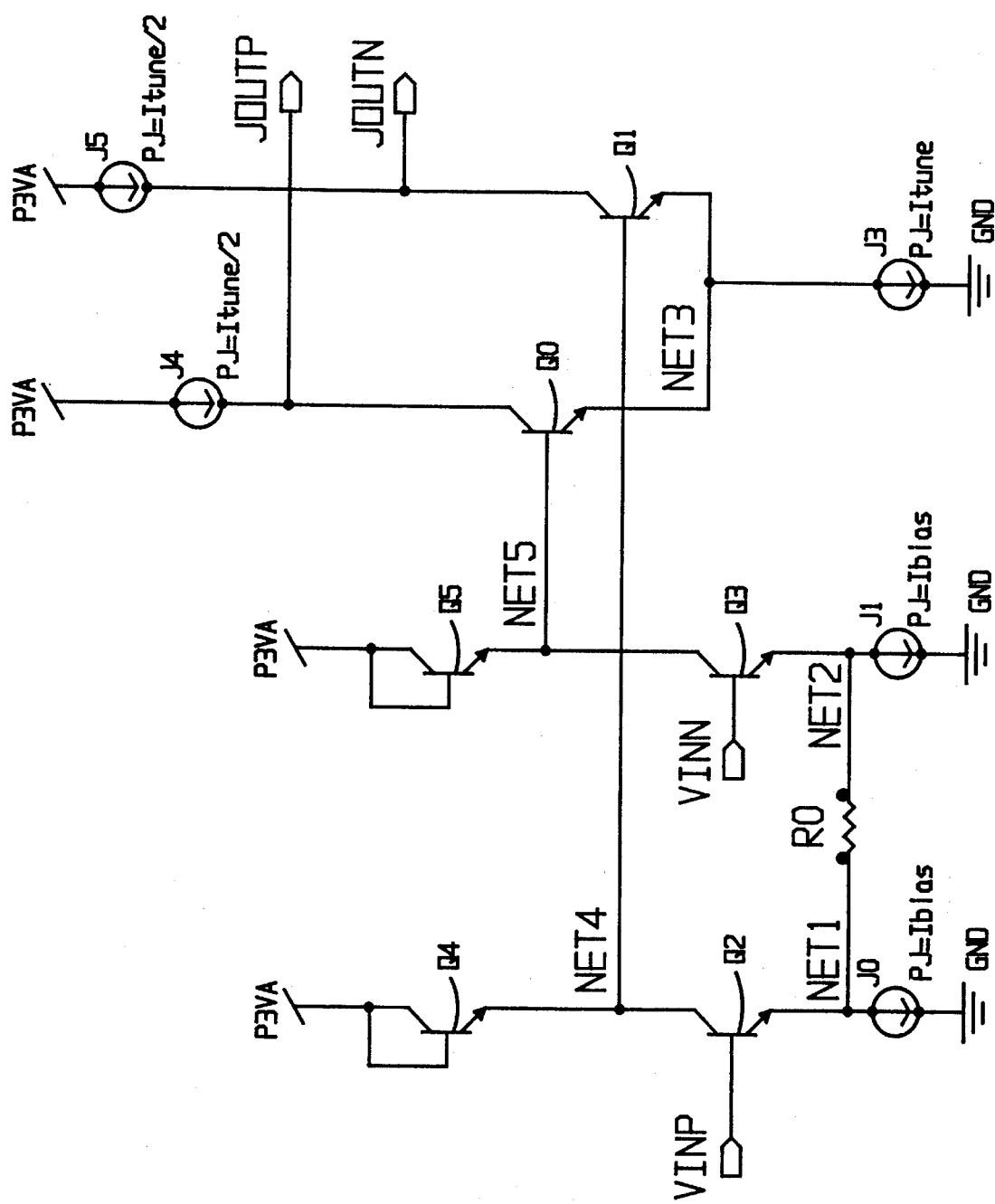
FIG. 4 is a schematic diagram illustrating a prior art operational transconductance amplifier (OTA)

Only matching of the base-emitter voltage drop $V_{BE}$ of NPN devices 30, 32, 34, 36, 38, 40, 42 and 44 is critical for matching of the GM of the OTAs 12. In the prior art as shown in FIG. 4, matching of the GM of the OTAs is set by the matching of the current sources Itune for each OTA. Since $V_{BE}$s tend to match better than integrated current sources, OTAs 12 provide a significant improvement over the prior art.

Figure 3A:
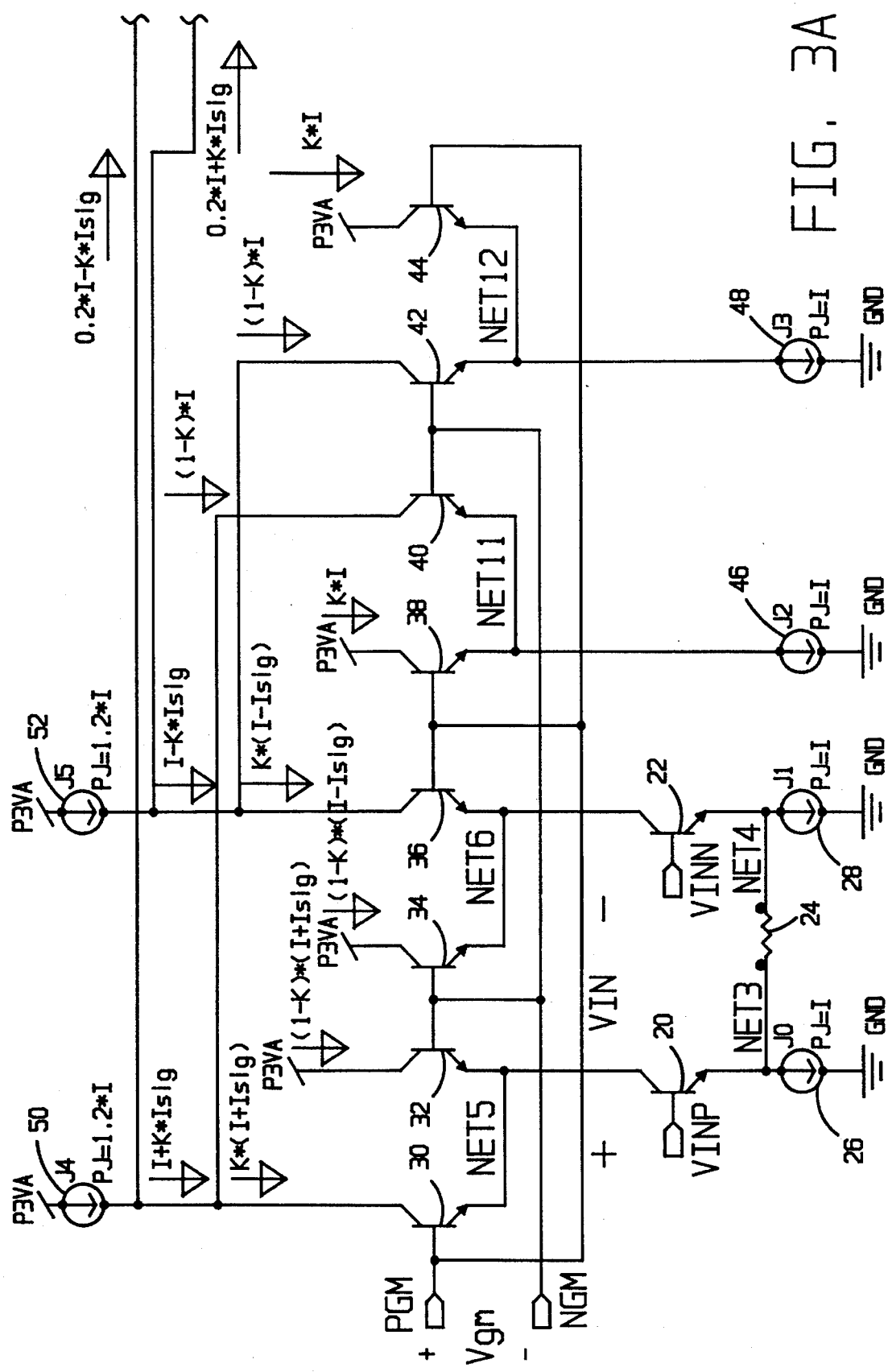
FIGS. 3A and 3B together provide a schematic diagram illustrating transconductance adjustment and common mode feedback circuitry of the operational transconductance amplifier (OTA) of the invention that can be used in the biquad filter section of FIG. 1.
Figure 3B:
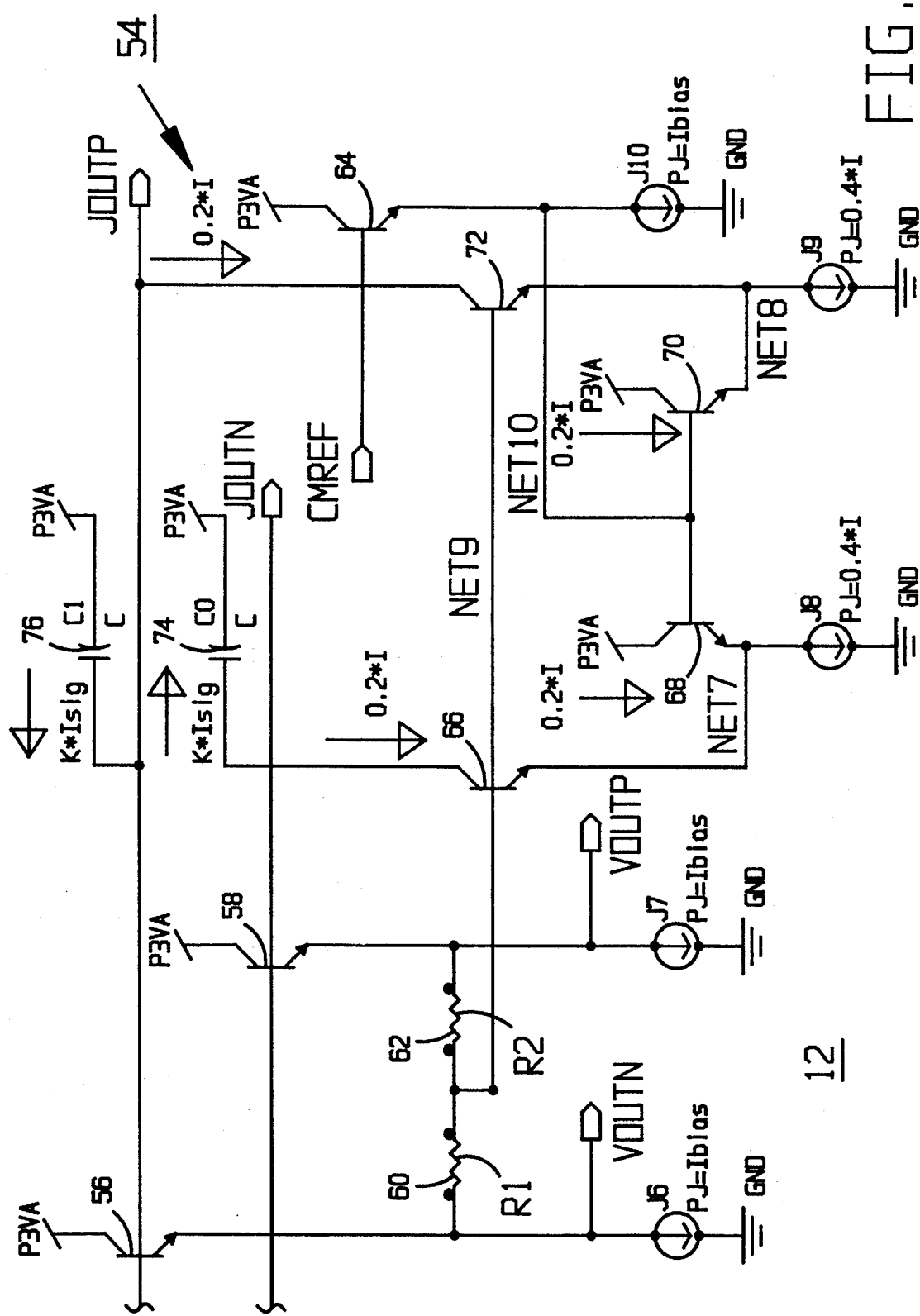

FIGS. 3A and 3B together show the schematic of the entire OTA 12 with the transconductance adjustment feature and common mode feedback circuitry generally designated by reference character 54. Ideally, the adjustment of GM of the OTAs 12 works well when the current sources 50 and 52, J4 and J5 each have a value of I, the same as current sources 26, 28, 46 and 48, J0, J1, J2 and J3. The common mode feedback circuit 54 accurately controls the common mode voltage so that the net current sourced into the high impedance nodes JOUTP/JOUTN is I.

Referring to FIG. 3, notice that current sources J4 and J5, 50 and 52, each source 1.2*I into the JOUTP and JOUTN ports, respectively. This is 20 percent too much and the excess 0.2*I is sunk by the common mode feedback loop 54. The high impedance nodes JOUTP and JOUTN drive a pair of emitter followers 56 and 58, respectively. A voltage divider formed by resistors (R1 and R2) 60 and 62 creates a signal at NET9 that is equal to the average of JOUTP and JOUTN signals shifted down by one base-emitter voltage drop $V_{BE}$. The CMREF input port is driven by a voltage of roughly 0.6 volts below the P3VA power supply. An emitter follower 64, biased at the same current as emitter followers 56 and 58, buffers the CMREF voltage at NET10. Bipolar differential NPN transistor pairs 66 and 68 and 70 and 72 form the input stage of the common mode feedback correction circuit 54. If the current sourced by current sources 50 and 52, J4 and J5, into JOUTP and JOUTN, respectively, is too large, then the average voltage generated at NET9 rises above the reference voltage found at NET10 and the collector current of NPN transistors 66 and 72 increases, which in turn decreases the net current sourced into JOUTP and JOUTN. Likewise, if the current sourced by current sources 50 and 52, J4 and J5, is too small, then the current sunk by bipolar transistors 66 and 72 decreases, so that under any extremes in the average current of current sources 50 and 52, J4 and J5, a current of I is sourced into the high impedance nodes JOUTP and JOUTN. The bias current of the differential NPN transistor pairs 66 and 68 and 70 and 72 is 0.4*I so that under a balanced condition each of these four devices 66, 68, 70 and 72 will conduct 0.2*I, which is the amount required. A net effect of circuit 54 is that the common mode Vds of the PFET devices (not shown) that form current sources 50 and 52, J4 and J5 in the circuit is held to a constant value of 0.6 volts. This results in improved power supply rejection in that the current sourced by the respective current sources 50 and 52, J4 and J5, is more constant with changes in the power supply voltage, P3VA. Two capacitors 74 and 76, C0 and C1 provide a dual function. Firstly, capacitors 74 and 76, C0 and C1 are the low frequency rolloff capacitors for the common mode feedback loop 54. Secondly, capacitors 74 and 76, C0 and C1 are required in the signal path of the continuous-time biquad filter section shown in FIG. 1. The voltage buffers 16, BUF1 and BUF2 shown in FIG. 1, are simply the emitter follower outputs VOUTP/VOUTN from FIG. 3.

The common mode feedback circuit 54 controls the common mode level of the high impedance nodes JOUTP/JOUTN to a higher accuracy than known prior art circuits.

Since the gain of the bipolar differential transistor pairs 66 and 68 and 70 and 72 is high, the common mode level variation will be quite small. This is especially important in low power supply applications where there is little room for common mode level variations. This common mode feedback circuit 54 can also be used in any of the prior art circuits to improve their common mode level accuracy enabling prior art circuits to work at a lower supply voltage.

Figure 5A:
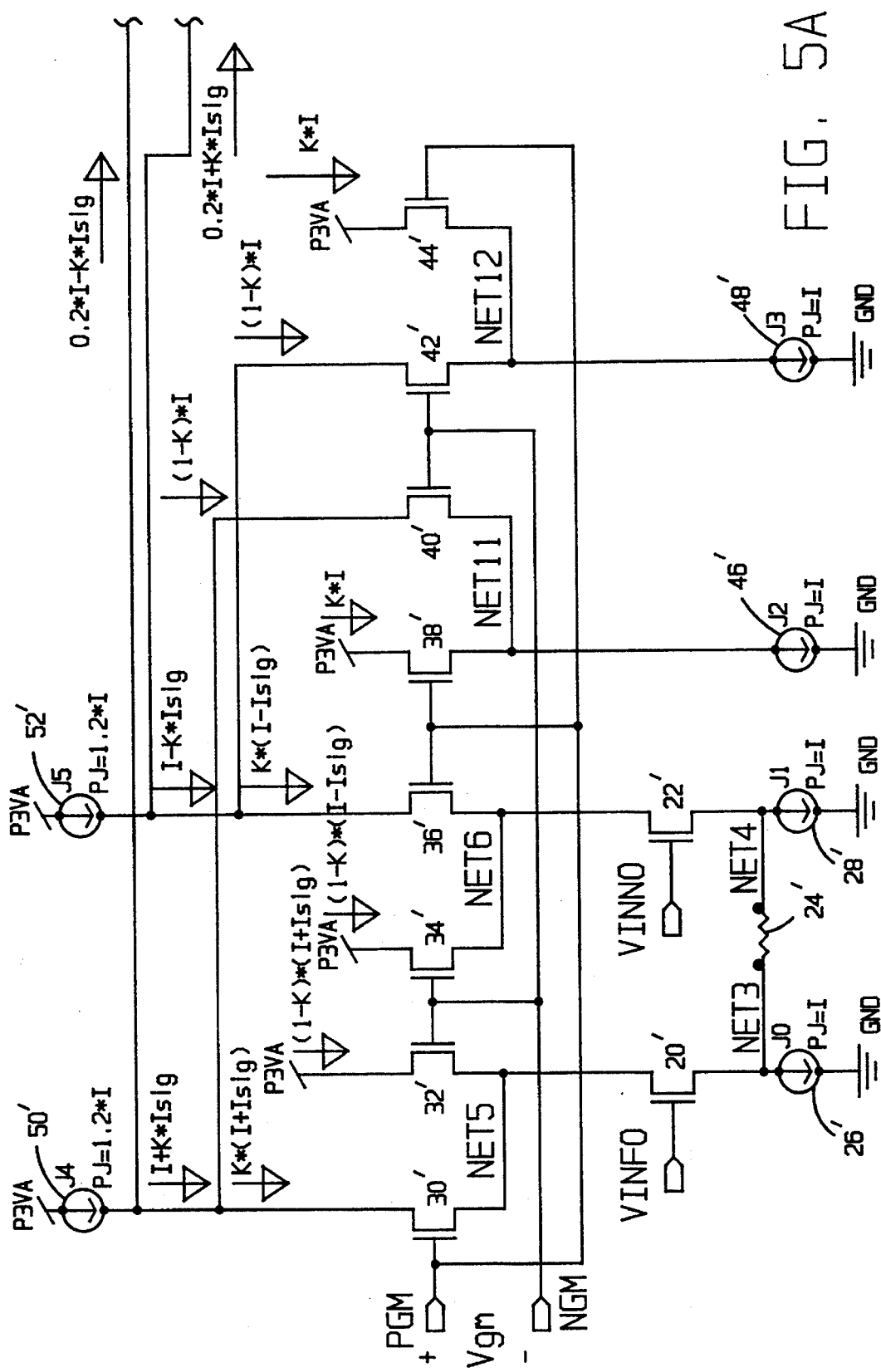
FIGS. 5A and 5B are schematics similar to FIGS. 3A and 3B illustrating an all field effect transistor (FET) equivalent circuit.
Figure 5B:
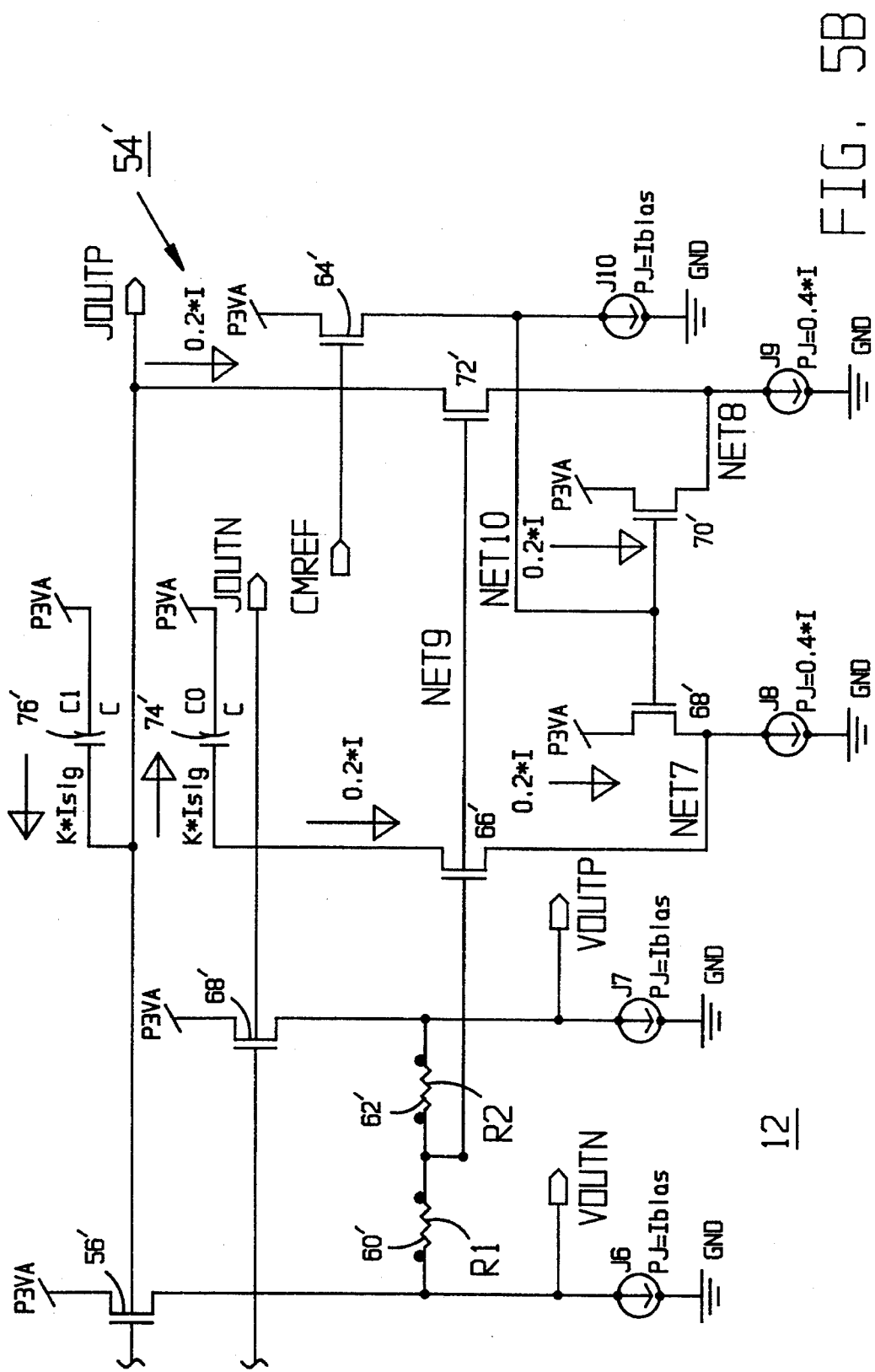

An all field effect transistor (FET) equivalent circuit may be used (as shown in FIGS. 5A and 5B) for the differential pairs that form the common mode feedback circuit 66, 68, 70 and 72 and for the GM adjustment circuit formed by 30, 32, 34, 36, 38, 40 and 42. FET source followers may also replace emitter followers 56 and 58. In FIGS. 5A and 5B, the same reference numbers as shown in FIGS. 3A and 3B are used with a prime notation added for identical and equivalent components.

OTAs 12 are general purpose and can be used, for example to implement low pass, high pass and bandpass filters, variable gain amplifiers, voltage controlled oscillators and impedance translators. For example, OTAs 12 advantageously can be used for the applications described by Randall L. Geiger and Edgar Sanchez-Sinencio in "Active Filter Design Using Operational Transconductance Amplifiers: A Tutorial," *IEEE Circuits and Devices Magazine*, March 1985, pp. 20–32.

While the invention has been described with reference to details of the illustrated embodiments, these details are not intended to limit the scope of the invention as defined in the appended claims.

We claim:

1. An integrated biquadratic, continuous-time filter section using operational transconductance amplifiers (OTAs), the improvement comprising:

each OTA including four differential transistor pairs;

means for simultaneously changing a transconductance (GM) of each of the OTAs by adjusting a differential voltage applied to each of said four differential transistor pairs.

2. An integrated biquadratic, continuous-time filter section as recited in claim 1 wherein said four differential transistor pairs are formed by bipolar transistors and matching of said transconductance (GM) of each of the OTAs includes matching of a base-emitter voltage ($V_{BE}$) of said plurality of differential transistor pairs.

3. An integrated biquadratic, continuous-time filter section as recited in claim 1 wherein said four differential transistor pairs are formed by field effect transistors and matching of said transconductance (GM) of each of the OTAs includes matching of a threshold voltage ($V_T$) of said plurality of differential transistor pairs.

4. An integrated biquadratic, continuous-time filter section as recited in claim 1 wherein said OTAs include a plurality of current sources respectively coupled to said four differential transistor pairs and common mode feedback means for controlling a common mode output voltage level.

5. An integrated biquadratic, continuous-time filter section as recited in claim 4 wherein said common mode feedback means include a pair of low frequency rolloff capacitors, and wherein said pair of low frequency rolloff capacitors are provided in the signal path for the integrated biquadratic, continuous-time filter section.

6. An integrated biquadratic, continuous-time filter section as recited in claim 4 wherein said common mode feedback means include an input stage including a pair of differential transistor pairs coupled to high impedance output nodes and said differential transistor pairs controlling said common mode output voltage level of said high impedance output nodes.

7. An integrated biquadratic, continuous-time filter section comprising:

a plurality of operational transconductance amplifiers (OTAs); each OTA including four differential transistor pairs;

adjustable voltage means for simultaneously changing a transconductance (GM) of each of the OTAs by adjusting a differential voltage applied to each of said four differential transistor pairs; and each of said OTAs including a plurality of current sources and common mode feedback means for controlling a common mode output voltage level.

8. An integrated biquadratic, continuous-time filter section as recited in claim 7 wherein the integrated biquadratic, continuous-time filter section is a low pass filter section and a cut-off frequency of the low pass filter section is changed by said adjustable voltage means for simultaneously changing a transconductance (GM) of each of the OTAs.

9. An integrated biquadratic continuous-time filter section as recited in claim 7 wherein said common mode feedback means include an input stage including a pair of differential transistor pairs coupled to high impedance output nodes and said differential transistor pairs controlling a common mode level of said high impedance output nodes.

10. An integrated operational transconductance amplifier (OTA) comprising:

four differential transistor pairs;

means for changing a transconductance (GM) of the OTA by adjusting a differential voltage applied to each of said four differential transistor pairs;

a plurality of current sources;

common mode feedback means for controlling a common mode output voltage level; and said means for changing a transconductance (GM) of the OTA being independent of said common mode output voltage level control.

11. An integrated operational transconductance amplifier (OTA) as recited in claim 10 wherein said common mode voltage level control at high impedance nodes of the OTA by said common mode feedback means effects improved power supply rejection for a pair of current sources connected between each power supply of the OTA and the high impedance nodes.

12. An integrated operational transconductance amplifier (OTA) as recited in claim 10 wherein said four differential transistor pairs are formed by bipolar transistors and said bipolar transistors have a substantially matching base-emitter voltage ($V_{BE}$).

13. An integrated operational transconductance amplifier (OTA) as recited in claim 10 wherein said four differential transistor pairs are formed by field effect transistors (FETs) and said FETs have a substantially matching threshold voltage ($V_T$).

* * * * *